(12) United States Patent
Menard et al.

(10) Patent No.: US 9,530,875 B2
(45) Date of Patent: Dec. 27, 2016

(54) HIGH-VOLTAGE VERTICAL POWER COMPONENT

(71) Applicants: STMicroelectronics (Tours) SAS, Tours (FR); Universite Francois Rabelais, Tours (FR)

(72) Inventors: Samuel Menard, Tours (FR); Gael Gautier, Veretz (FR)

(73) Assignees: STMicroelectronics (Tours) SAS, Tours (FR); Universite Francois Rabelais, Tours (FR)

( * ) Notice: Subject to any disclaimer, the term of this patent is extended or adjusted under 35 U.S.C. 154(b) by 0 days.

(21) Appl. No.: 14/990,194

(22) Filed: Jan. 7, 2016

(65) Prior Publication Data

US 2016/0118485 A1    Apr. 28, 2016

Related U.S. Application Data

(63) Continuation of application No. 14/510,663, filed on Oct. 9, 2014.

(30) Foreign Application Priority Data

Oct. 17, 2013    (FR) ..................... 13 60094

(51) Int. Cl.
*H01L 29/747*    (2006.01)
*H01L 29/87*    (2006.01)
(Continued)

(52) U.S. Cl.
CPC ......... *H01L 29/747* (2013.01); *H01L 29/0615* (2013.01); *H01L 29/0642* (2013.01);
(Continued)

(58) Field of Classification Search
CPC ............. H01L 29/747; H01L 29/66386; H01L 29/0615; H01L 29/0649; H01L 29/0642; H01L 29/0661; H01L 29/87
See application file for complete search history.

(56) References Cited

U.S. PATENT DOCUMENTS

2001/0011717 A1\* 8/2001 Mathieu ................ H01L 21/761
252/500
2004/0124439 A1\* 7/2004 Minami ............ H01L 21/76289
257/200
(Continued)

FOREIGN PATENT DOCUMENTS

| FR | 2969823 A1 | 6/2012 |
|---|---|---|
| FR | 2987698 A1 | 9/2013 |
| FR | 2991504 A1 | 12/2013 |

OTHER PUBLICATIONS

INPI Search Report and Written Opinion for FR 1360094 dated Jun. 30, 2014 (8 pages).
(Continued)

*Primary Examiner* — Ermias Woldegeorgis
(74) *Attorney, Agent, or Firm* — Gardere Wynne Sewell, LLP

(57) ABSTRACT

A vertical power component includes a silicon substrate of a first conductivity type with a well of the second conductivity type on a lower surface of the substrate. The first well is bordered at a component periphery with an insulating porous silicon ring. An upper surface of the porous silicon ring is only in contact with the substrate of the first conductivity type. The insulating porous silicon ring penetrates into the substrate down to a depth greater than a thickness of the well.

16 Claims, 5 Drawing Sheets

(51) Int. Cl.
  *H01L 29/06* (2006.01)
  *H01L 29/66* (2006.01)
(52) U.S. Cl.
  CPC ...... *H01L 29/0649* (2013.01); *H01L 29/0661* (2013.01); *H01L 29/66386* (2013.01); *H01L 29/87* (2013.01)

(56) References Cited

U.S. PATENT DOCUMENTS

| 2007/0145408 A1* | 6/2007 | Menard | H01L 29/0692 257/107 |
| 2009/0023268 A1 | 1/2009 | Wu et al. | |
| 2011/0210372 A1* | 9/2011 | Menard | H01L 29/0646 257/119 |

OTHER PUBLICATIONS

Samuel Menard et al : "Non-oxidized porous silicon-based power AC switch périphéries", Nanoscale Research Letters, Dec. 1, 2012, pp. 1-10, XP55124671.

* cited by examiner

HIGH-VOLTAGE VERTICAL POWER COMPONENT

CROSS-REFERENCE TO RELATED APPLICATIONS

This application is a continuation application from U.S. patent application Ser. No. 14/510,663 filed Oct. 9, 2014, which claims priority from French Application for Patent No. 1360094 filed Oct. 17, 2013, the contents of which are hereby incorporated by reference to the maximum extent allowable by law.

TECHNICAL FIELD

The present disclosure relates to a vertical semiconductor power component capable of withstanding a high voltage (higher than 500 V) and more specifically to the structure of the periphery of such a component.

BACKGROUND

FIGS. 1 to 4 are cross-section views showing triac-type high-voltage power components having a vertical structure. The triacs of these various drawings differ by their periphery.

Generally, the drawings show a triac formed from a lightly-doped N-type substrate 1 ($N^-$). The upper and lower surfaces of substrate 1 comprise P-type doped layers or wells 3 and 4. Upper layer 3 contains a heavily-doped N-type region 5 ($N^+$) and lower layer 4 contains a heavily-doped N-type region 6 ($N^+$) in an area substantially complementary to that taken up, in top view, by region 5. Main electrodes A1 and A2 are respectively arranged on the upper surface and on the lower surface of substrate 1. According to cases, electrode A2 extends on all or part of the lower surface of substrate 1. The structure also comprises, on its upper surface side, a gate region topped with a gate electrode (not shown).

FIG. 1 shows a triac in mesa technology. P-type layers 3 and 4 respectively extend over the entire upper surface and over the entire lower surface of a lightly-doped N-type substrate 1 ($N^-$). A ring-shaped groove is formed at the periphery of the upper surface of the triac and penetrates deeper into substrate 1 than layer 3. Similarly, a groove is formed at the periphery of the lower surface of the triac and penetrates deeper into substrate 1 than layer 4. The grooves are filled with a passivation glass 9, forming a glassivation. The PN junctions between each of P-type layers 3 and 4 and $N^-$-type substrate 1 emerge onto glass 9. Main electrodes A1 and A2 are respectively arranged on the upper surface and on the lower surface of the triac.

FIG. 2 shows a triac in planar technology. P-type wells 3 and 4 are formed in lightly-doped N-type silicon substrate 1 ($N^-$), respectively on the upper surface side and on the lower surface side of substrate 1. The upper and lower peripheries of the triac thus correspond to substrate 1. Main electrodes A1 and A2 are respectively arranged on well 3 and on well 4. An insulating layer 11 is arranged on portions of the lower and upper surfaces of the triac which are not covered by electrodes A1 and A2. Heavily-doped N-type channel stop rings 13 and 14 ($N^+$) are formed in substrate 1, respectively at the periphery of the upper surface and at the periphery of the lower surface of the triac.

FIG. 3 shows a triac in "planar well" technology. The component of FIG. 3 differs from that in FIG. 2 in that it is surrounded by a P-type diffused wall 15. The lower surface of the triac is totally coated with a main electrode A2 and a P-type layer 4 extends over the entire lower surface of substrate 1 all the way to wall 15. A P-type well 3 extends on the upper surface side of the triac and stops before diffused wall 15. A channel stop ring 13 is arranged in substrate 1 between well 3 and wall 15. A ring-shaped electrode 17 may coat channel stop ring 13.

FIG. 4 shows a variation of a triac in "planar well" technology such as described in relation with FIG. 2 of French Application for Patent No. 1254987 filed on May 30, 2012 (incorporated by reference). The triac of FIG. 4 differs from the triac of FIG. 3 in that, on its lower surface side, a lower portion of diffused peripheral wall 15 which surrounds the component has been turned into insulating porous silicon forming an insulating ring 19. Porous silicon insulating ring 19 penetrates into substrate 1 down to a depth greater than the thickness of layer 4.

Each of the triacs of FIGS. 1 to 4 has various advantages and disadvantages.

In practice, in the mesa-type structure of FIG. 1, the steps of etching the grooves, of filling the grooves with passivation glass 9, and of cutting passivation glass 9 are difficult to implement.

In the planar structure of FIG. 2, a disadvantage is linked to the component assembly step. Indeed, if electrode A2 is desired to be soldered to a plate, lateral solder wickings may electrically connect electrode A2 to substrate 1, thus short-circuiting the corresponding $PN^-$ junction. It is thus necessary to assemble the component on a pad, which makes the assembly more complicated.

In the "planar well" structures of FIGS. 3 and 4, wall 15 isolates $N^-$-type substrate 1 from possible solder wickings on the lateral surfaces of the triac on assembly thereof. However, the structures of FIGS. 3 and 4 require forming lateral wall 15 by diffusion of dopant elements from the lower and upper surfaces of substrate 1. A disadvantage is that this step is long, typically in the order of 250 hours for a substrate having a thickness from 200 to 300 µm and a boron doping. Further, it is necessary to provide an additional space at the triac periphery to form lateral wall 15, lateral wall 15 extending across a width in the order of the thickness of substrate 1.

The guard distance, that is, the distance necessary between the component edge and the edge of the useful portion of the component, depends on the type of periphery involved. For example, for a breakdown voltage in the order of 800 volts:

guard distance $e_1$ of the structure of FIG. 1 is in the order of 300 µm,
  guard distance $e_2$ of the structure of FIG. 2 is in the order of 200 µm, and
  guard distance $e_3$ of the structures of FIGS. 3 and 4 is in the order of 400 µm.

SUMMARY

It would be desirable to have a vertical power component having a periphery which cumulates the advantages of prior structures while avoiding the disadvantages thereof. More specifically, it is desired to form a structure which:
  enables to avoid short-circuits due to lateral solder wickings on assembly of the component,
  enables to have the lowest possible guard distance, and
  is simple to manufacture.

Thus, an embodiment provides a vertical power component comprising a silicon substrate of a first conductivity type and on the side of a lower surface of the substrate, a first well of the second conductivity type bordered at the component periphery with a first insulating porous silicon ring having its upper surface only in contact with the substrate of the first conductivity type, the first insulating ring penetrating into the substrate down to a depth greater than the thickness of the first well.

According to an embodiment, the component further comprises, on the upper surface side of the substrate, a second well of the second conductivity type bordered at the component periphery with a second insulating porous silicon ring having its lower surface only in contact with the substrate of the first conductivity type, the second insulating ring penetrating into the substrate down to a depth greater than the thickness of the second well.

According to an embodiment, the porous silicon is oxidized.

According to an embodiment, the first conductivity type is type N.

According to an embodiment, the component forms a triac.

Another embodiment provides a method of manufacturing a vertical power component comprising the steps of: forming, in an N-type doped substrate, first and second P-type doped wells respectively on the lower surface side and on the upper surface side of the substrate, plunging the lower surface of the substrate into a first electrolytic bath, and circulating a first current between the upper surface of the substrate and the first electrolytic bath to form porous silicon on the lower surface side of the substrate.

According to an embodiment, the method further comprises the steps of: plunging the upper surface of the substrate into a second electrolytic bath, and circulating a second current between the lower surface of the substrate and the second electrolytic bath to form porous silicon on the upper surface side of the substrate.

According to an embodiment, the method further comprises an anneal step to oxidize the porous silicon.

According to an embodiment, the method further comprises forming first and second N-type doped regions respectively in the first well and in the second well.

According to an embodiment, the method further comprises forming an N-type doped gate in the second well.

According to an embodiment, the method further comprises forming a channel stop ring on the upper surface side of the substrate.

BRIEF DESCRIPTION OF THE DRAWINGS

The foregoing and other features and advantages will be discussed in detail in the following non-limiting description of specific embodiments in connection with the accompanying drawings, wherein.

For clarity, the same elements have been designated with the same reference numerals in the various drawings and, further, as usual in the representation of semiconductor components, the various drawings are not to scale.

DETAILED DESCRIPTION OF THE DRAWINGS

Figure 5:
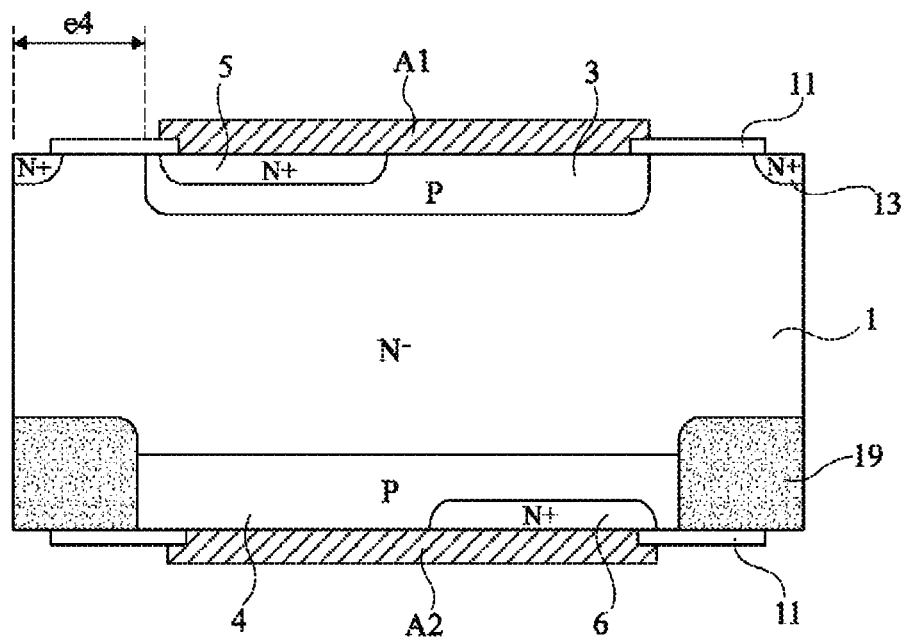
FIG. 5 schematically shows a cross-section view of an embodiment of a triac.

FIG. 5 shows an embodiment of a vertical triac-type power component. The triac comprises a lightly-doped N-type silicon substrate 1 ($N^-$). P-type doped wells 3 and 4 are respectively arranged on the upper surface side and on the lower surface side of substrate 1. Well 3 contains a heavily-doped N-type region 5 ($N^+$). Similarly, well 4 contains a heavily-doped N-type region 6 ($N^+$) in an area substantially complementary to that occupied, in top view, by region 5. Main electrodes A1 and A2 are respectively arranged on well 3 and on well 4. An insulating layer 11 is arranged on the upper and lower surfaces of the structure, at the external periphery of wells 3 and 4. A heavily-doped N-type channel stop ring 13 ($N^+$) is formed in substrate 1, on the upper surface side thereof, at the triac periphery. A gate region topped with a gate electrode (not shown) is formed on the upper surface side of the triac.

On the lower surface side, well 4 is laterally bordered with an insulating porous silicon ring 19 formed at the triac periphery. Ring 19 penetrates into the substrate down to a depth greater than the thickness of well 4.

Ring 19 forms a junction end for the PN junction between $N^-$-type substrate 1 and P-type well 4.

The presence of insulating ring 19 at the periphery of the lower surface of the triac advantageously enables to avoid for solder wickings on the lateral surfaces of the triac to electrically connect substrate 1 to electrode A2 when electrode A2 of the triac is assembled on a plate, for example, via a solder paste.

Figure 6A:
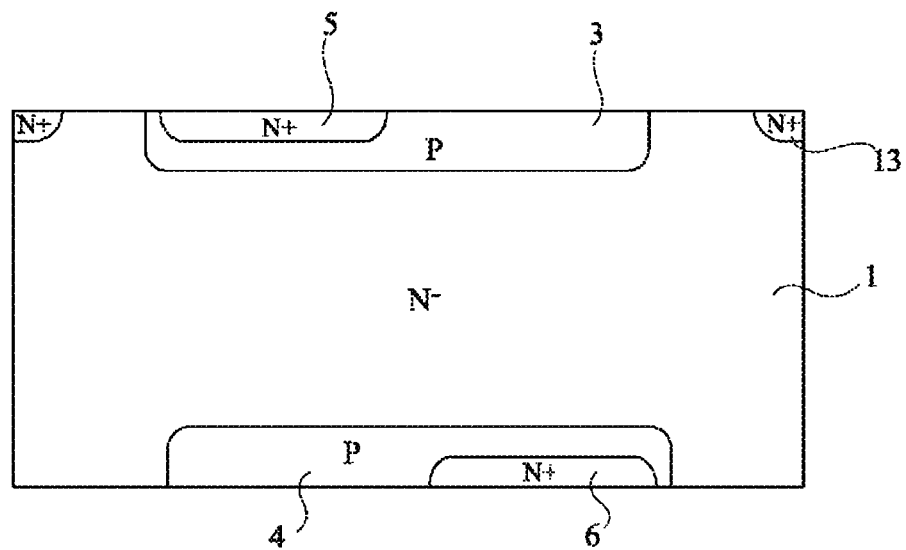
FIGS. 6A to 6C are simplified cross-section views illustrating a method of manufacturing the triac of FIG. 5.
Figure 6B:
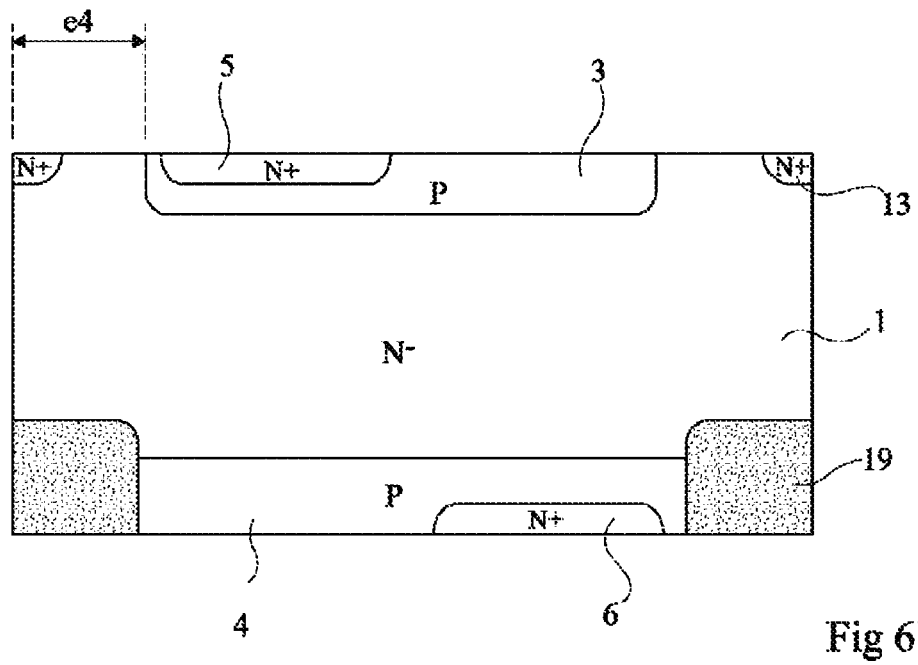
Figure 6C:
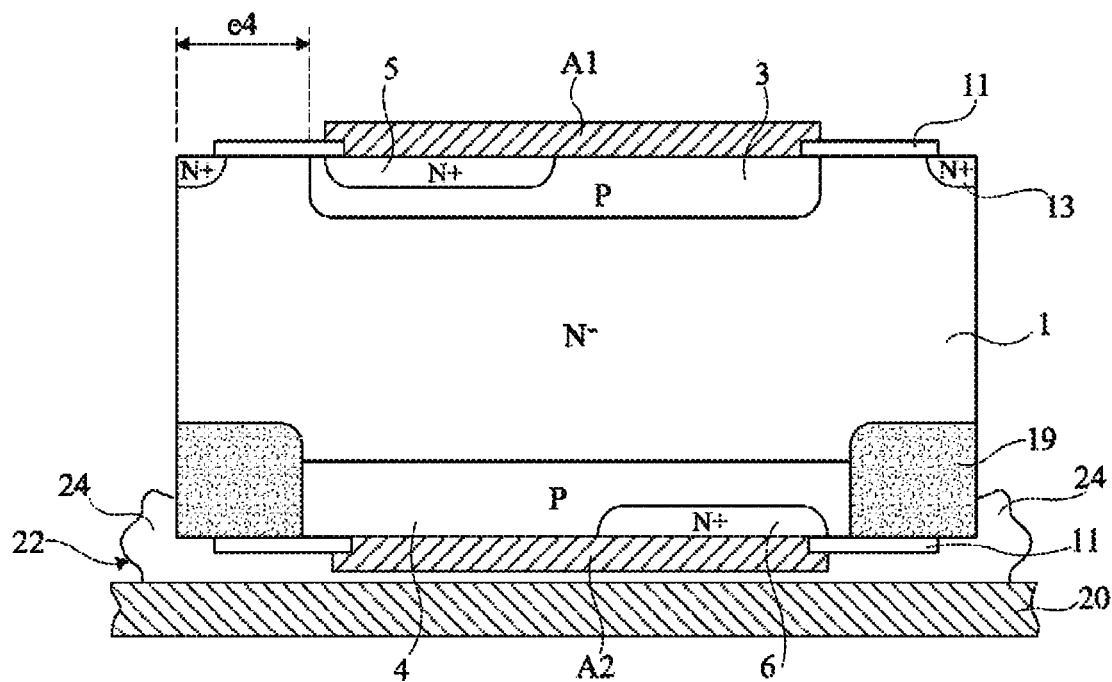

FIGS. 6A to 6C are simplified cross-section views of structures obtained at successive steps of an embodiment of a method of manufacturing a triac-type vertical power component such as described in relation with FIG. 5.

FIG. 6A shows a portion of a lightly-doped N-type silicon substrate 1 ($N^-$) after the steps of:
  forming two P-type doped wells 3 and 4 in substrate 1, respectively on the upper surface side and on the lower surface side of the triac;
  forming heavily-doped N-type regions 5 and 6 ($N^+$) respectively in well 3 and in well 4; and
  forming a heavily-doped N-type channel stop ring 13 ($N^+$) at the periphery of the upper surface of the triac.

As an example, the thickness of substrate 1 is in the range from 200 to 300 μm, for example, 250 μm. The dopant elements concentration in substrate 1 may be in the range from $10^{14}$ to $10^{15}$ at./cm$^3$, for example, $5*10^{14}$ at./cm$^3$.

Wells 3 and 4 may be formed by conventional implantation and/or diffusion steps, for example, by boron implantation in substrate 1. The dopant element concentration of wells 3 and 4 may be in the range from $10^{18}$ to $10^{19}$ at./cm$^3$, for example, $5*10^{18}$ at./cm$^3$. Wells 3 and 4 may have thicknesses in the range from 10 to 50 μm. As an example, for a triac breakdown voltage in the order of 600 V, the thickness of wells 3 and 4 may be approximately 20 μm.

Regions 5 and 6, as well as channel stop ring 13, may be formed by conventional implantation and/or diffusion steps. The dopant element concentration in regions 5 and 6 and in channel stop ring 13 may be greater than $10^{19}$ at./cm$^3$, for example, $10^{20}$ at./cm$^3$. Regions 5 and 6 and channel stop ring 13 may have thicknesses in the range from 5 to 20 μm, for example approximately 10 μm.

FIG. 6B shows the triac after the forming of an insulating porous silicon ring 19. The porous silicon of insulating ring 19 may be formed during the steps of:

plunging the lower surface of the substrate into an electrolytic bath comprising a mixture, for example, of hydrofluoric acid and/or ethanoic acid, having a negative electrode plunged into it;

arranging a positive electrode on the upper surface of the substrate or plunging the upper surface of the substrate into an electrolytic bath comprising a mixture, for example, of hydrofluoric acid and/or ethanol, having a positive electrode plunged into it; and applying a voltage between the positive electrode and the negative electrode to have a hole current flow in substrate 1, the hole current flowing from the conductive PN junction between N-type substrate 1 and P-type well 3 all the way to the exposed lower surface of the substrate.

The time for which this last step is carried on is sufficiently long for porous silicon ring 19 to form across a desired thickness.

An additional porous silicon oxidation step may be carried out, for example, by means of an anneal at 1,000° C. for a plurality of hours under an oxygen atmosphere. This step enhances the insulating character of the porous silicon.

Insulating ring 19 forms at the periphery of P-type well 4. Insulating ring 19 penetrates deeper into substrate 1 than well 4. In particular, the thickness of the insulating ring will be selected to be greater than the thickness of well 4 and to avoid the disadvantages due to lateral solder wickings on assembly of the triac. As an example, the thickness of the insulating ring is in the range from 20 to 80 µm, for example, 40 µm for a well 4 having a 20-µm thickness.

Figure 3:
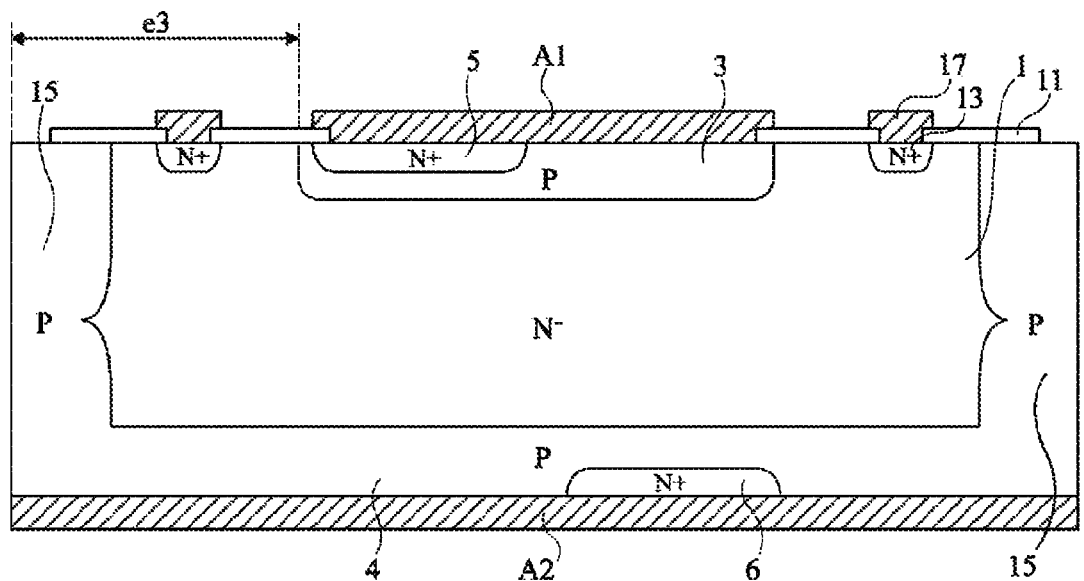
FIGS. 3 and 4, previously described, schematically show cross-section views of two triacs in "planar well" technology.
Figure 4:
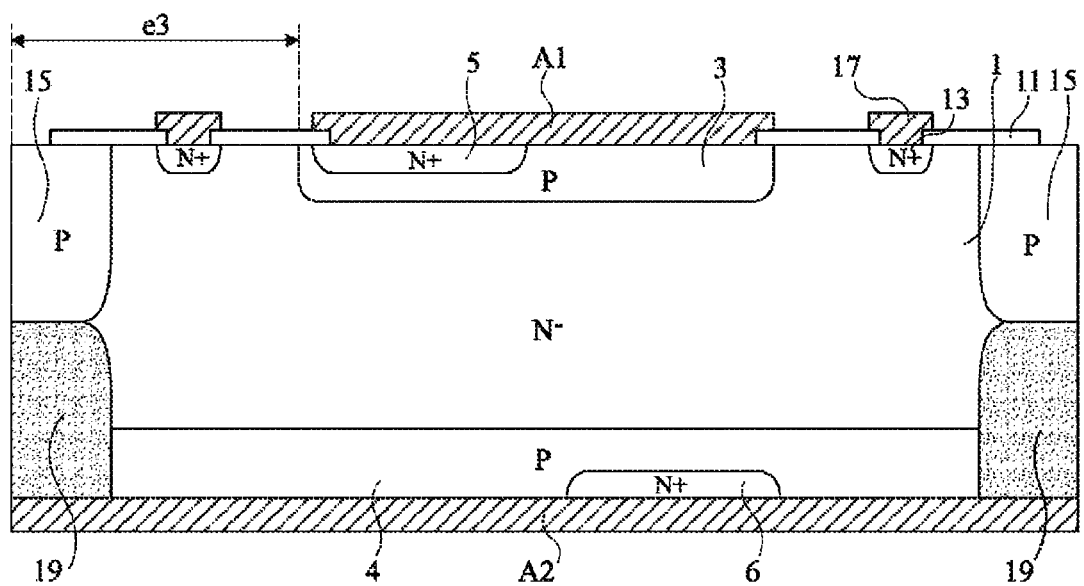

It should be noted that insulating ring 19 is not formed in a diffused lateral wall 15 such as described in relation with FIG. 4. The absence of diffused lateral wall enables to do away with the long diffusion step necessary to form the diffused wall. Further, the absence of a lateral wall enables to suppress the peripheral space necessary to form the lateral wall, thus decreasing the triac surface area as compared with the triacs of FIGS. 3 and 4.

Figure 1:
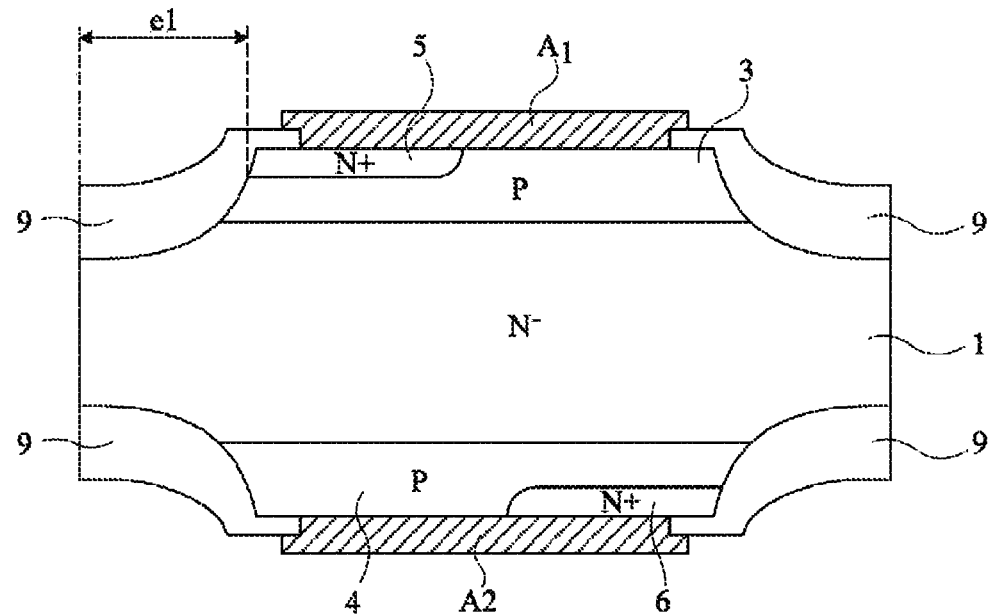
FIG. 1, previously described, schematically shows a cross-section view of a triac in "mesa" technology.
Figure 2:
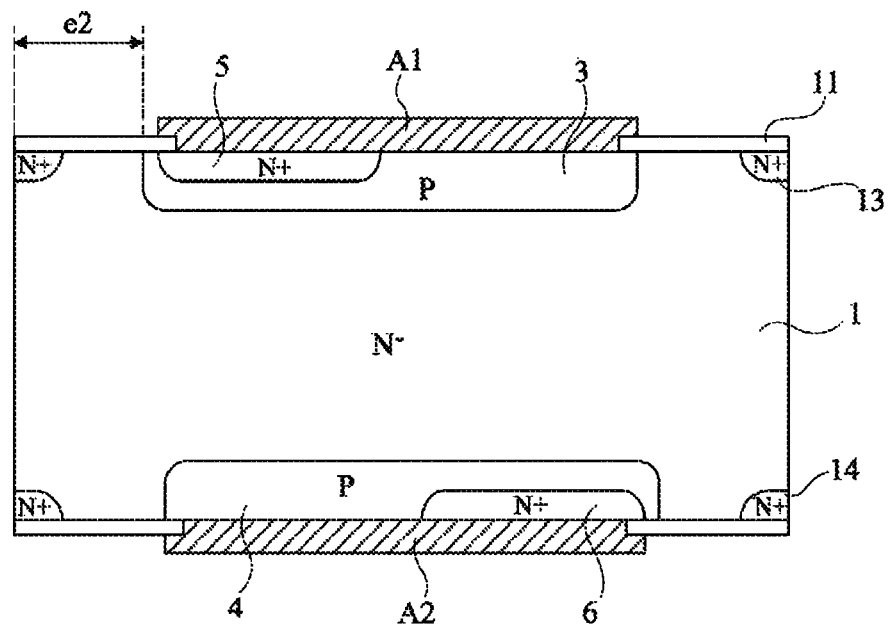
FIG. 2, previously described, schematically shows a cross-section view of a triac in "planar" technology.

In the triac of FIG. 5, guard distance $e_4$ between the active portion of the triac and the peripheral edge of the triac is equal to the guard distance of a "planar"-type triac such as described in relation with FIG. 2. It should be reminded, as previously indicated in relation with FIGS. 1 to 4, that the guard distance of a planar-type structure is shorter than the guard distances of mesa- and "planar well"-type structures.

FIG. 6C shows the triac after the steps of:

forming an insulating layer 11, for example, made of glass, at least on the upper surface of the triac, at the external periphery of wells 3 and 4. On the upper surface side of the triac, layer 11 is in contact with N⁻-type substrate 1 and partly extends over the channel stop ring and well 3;

forming an electrode A1 on well 3 and forming an electrode A2 on well 4;

sawing silicon substrate 1 having the triac formed therein to obtain an individual component; and assembling the triac on a support 20.

During the step of sawing substrate 1, the absence of grooves filled with passivation glass such as described in relation with FIG. 1 enables to avoid the disadvantages associated with the cutting of glass.

The step of assembling the triac on support 20 may be carried out by using a solder paste 22. It should be noted that porous silicon insulating ring 19 enables to isolate substrate 1 from lateral solder wickings 24 of solder paste 22. It should be noted that, in the previously-described method, only four masking steps are necessary to manufacture the triac, that is:

one mask for the step of forming wells 3 and 4,
one mask for the step of forming regions 5 and 6,
one mask for the step of forming insulating layers 11, and
one mask for the step of forming electrodes A1 and A2.

Thus, the manufacturing method described in relation with FIGS. 6A to 6C is simple to implement.

Figure 7:
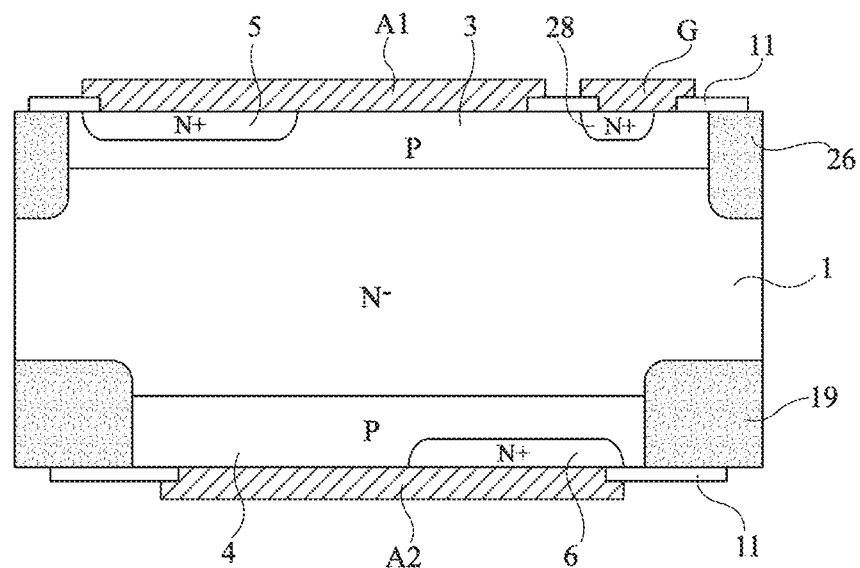
FIG. 7 is a simplified cross-section view of an alternative embodiment of a triac.

FIG. 7 illustrates an alternative embodiment of a vertical triac-type power component. The triac of FIG. 7 comprises same elements as the triac of FIG. 5, with the difference that P-type well 3 is laterally bordered with a peripheral insulating porous silicon ring 26. Insulating ring 26 penetrates into the substrate down to a depth greater than the thickness of well 3, the lower surface of insulating ring 19 being only in contact with N⁻-type substrate 1. As an example, the thickness of insulating ring 26 is in the range from 20 to 80 µm, for example, 40 µm for a well 3 having a 20-µm thickness.

Insulating ring 26 forms a junction end for the PN junction between P-type well 3 and N⁻-type substrate 1. Insulating ring 26 may be formed by inverting the direction of the current flowing through the triac during the step described in relation with FIG. 6B, the lower surface of the triac being in contact with an electrolytic bath comprising a mixture, for example, or hydrofluoric acid and of ethanol.

FIG. 7 shows a heavily-doped N-type gate region 28 (N⁺) formed in well 3, on the right-hand side of the drawing. Gate region 28 of the triac has not been shown in the other drawings. A gate electrode G coats region 28 and a portion of well 3.

Specific embodiments have been described. Various alterations, modifications, and improvements will occur to those skilled in the art. In particular, the present invention has been described in the case where the vertical power component is a triac. It should be understood that a similar structure may apply to any other type of known vertical bidirectional power component, for example, a bidirectional Shockley diode. The present invention may also apply to any type of unidirectional vertical power component. Further, the present invention is not limited to the example of the manufacturing method described in relation with FIGS. 6A to 6C to form the component. It will be within the abilities of those skilled in the art to form the provided structure by using any other known method to form the various layers, regions, and/or wells.

Although, in the previous embodiments, a guard ring 13 and regions 5 and 6 of same thicknesses and of same doping levels have been described, it will be within the abilities of those skilled in the art to adapt the thickness and the doping level of the different regions and/or layers forming the triac according to the characteristics desired for the triac. In particular, although embodiments with an N-type substrate have been described, the present invention also applies to a P-type substrate by inverting the conductivity types of each layer, region, and well.

Further, the various alterations and modifications generally adopted to form triacs may apply herein, for example, the provision of emitter short-circuit holes and its specific gate configurations.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A vertical power component, comprising:
a silicon substrate of a first conductivity type;
on a lower surface of the silicon substrate, a first well of a second conductivity type opposite the first conductivity;
at a peripheral border of said vertical power component, a first insulating porous silicon ring in said silicon substrate and in contact with a first PN junction between the first well and the silicon substrate;
wherein the first insulating porous silicon ring penetrates into the silicon substrate to a depth greater than a thickness of the first well.

2. The vertical power component of claim 1, further comprising:
on an upper surface of the silicon substrate opposite the lower surface, a second well of the second conductivity type;
at the peripheral border of said component, a second insulating porous silicon ring in said silicon substrate and in contact with a second PN junction between the second well and the silicon substrate;
wherein the second insulating ring penetrates into the silicon substrate to a depth greater than a thickness of the second well.

3. The vertical power component of claim 2, wherein the second porous insulating porous silicon ring has a lower surface that is only in contact with the silicon substrate.

4. The vertical power component of claim 2, wherein a side surface of the second insulating porous silicon ring is in contact with both the silicon substrate and the second well at said second PN junction.

5. The vertical power component of claim 1, wherein the first insulating porous silicon ring is oxidized.

6. The vertical power component of claim 1, wherein the first conductivity type is type N and the second conductivity type is P.

7. The vertical power component of claim 1, forming a triac.

8. The vertical power component of claim 1, wherein a side surface of the first insulating porous silicon ring is in contact with both the silicon substrate and the first well at said first PN junction.

9. The vertical power component of claim 1, wherein said first insulating porous silicon ring has an upper surface that is only in contact with the silicon substrate.

10. A vertical power component, comprising:
a silicon substrate doped with a first conductivity type and having an upper surface and a lower surface opposite said upper surface;
a first well in the lower surface of said silicon substrate doped with a second conductivity type opposite the first conductivity type;
a second well in the upper surface of said silicon substrate doped with the second conductivity type;
a first heavily doped region of the first conductivity type within the first well;
a second heavily doped region of the first conductivity type within the second well;
a ring region heavily doped of the first conductivity type surrounding but spaced apart from said second well; and
a porous silicon insulating ring surrounding and in contact with a PN junction present where said first well is in contact with the silicon substrate;
wherein the component lacks a surrounding diffused peripheral wall of the second conductivity type.

11. The vertical power component of claim 10, wherein a thickness of the porous silicon insulating ring is thicker than a thickness of the first well.

12. The vertical power component of claim 10, further comprising:
a first electrode on the lower surface in contact with the first well and the first heavily doped region; and
a second electrode on the upper surface in contact with the second well and the second heavily doped region.

13. A vertical power component, comprising:
a silicon substrate doped with a first conductivity type and having an upper surface and a lower surface opposite said upper surface;
a first well in the lower surface of said substrate doped with a second conductivity type opposite the first conductivity type;
a second well in the upper surface of said substrate doped with the second conductivity type;
a first insulating porous silicon ring surrounding said first well and in contact with a first PN junction present where the silicon substrate and first well are in contact with each other; and
a second insulating porous silicon ring surrounding said second well and in contact with a second PN junction formed by the silicon substrate and second well are in contact with each other.

14. The vertical power component of claim 13, further comprising: a gate electrode in contact with the second well on the upper surface of the substrate, the gate electrode insulated from said second electrode.

15. The vertical power component of claim 14, further comprising a heavily doped region of the first conductivity type in said second well and in contact with said gate electrode.

16. The vertical power component of claim 13, further comprising:
a first heavily doped region of the first conductivity type in said first well and in contact with said first electrode; and
a second heavily doped region of the first conductivity type in said second well and in contact with said second electrode.

* * * * *